(12) United States Patent
Froniewski et al.

(10) Patent No.: US 9,178,512 B2
(45) Date of Patent: *Nov. 3, 2015

(54) CAPACITIVE COUPLING BASED SENSOR

(75) Inventors: Jozef Froniewski, Palo Alto, CA (US);
Jay Li, Sunnyvale, CA (US);
Cheng-Hao Chen, Taipei (TW);
Yinn-Jang Wu, Campbell, CA (US)

(73) Assignee: Silego Technology, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/267,853

(22) Filed: Oct. 6, 2011

(65) Prior Publication Data
US 2012/0302164 A1 Nov. 29, 2012

Related U.S. Application Data

(63) Continuation of application No. 13/072,578, filed on Mar. 25, 2011, now Pat. No. 8,395,370.

(60) Provisional application No. 61/317,599, filed on Mar. 25, 2010, provisional application No. 61/400,394, filed on Jul. 26, 2010, provisional application No. 61/412,340, filed on Nov. 10, 2010.

(51) Int. Cl.
*G01R 19/00* (2006.01)
*G01R 31/06* (2006.01)
*H03K 17/975* (2006.01)

(52) U.S. Cl.
CPC .. *H03K 17/975* (2013.01); *H03K 2217/960775* (2013.01)

(58) Field of Classification Search
CPC .. H04B 7/0617; H04B 7/0417; H04B 7/0641; H04B 10/54; H04B 17/00; H04B 17/003; H04B 17/004; H04B 17/0062; H04B 17/0067; H04B 17/0072; H04B 1/38; H04B 5/0075; H04B 5/0087; H04B 5/02; H04B 7/0695; H04B 7/08; G06F 9/4443; G06F 1/1616; G06F 1/1679; G08C 17/06; G01R 31/007; G01R 31/318572; G01R 31/3272; H01G 5/16; H03M 1/466; H03M 1/804; H03K 17/975; H03K 2217/960775; H04M 1/0245; H04M 2250/12; H04W 52/0251

See application file for complete search history.

(56) References Cited

U.S. PATENT DOCUMENTS 3,172,075 A   3/1965 Kay
5,606,303 A * 2/1997 Suski .............................. 338/210
5,805,067 A   9/1998 Bradley et al.

(Continued)

FOREIGN PATENT DOCUMENTS

JP   H01103319   4/1989
JP   201076475   8/2010

OTHER PUBLICATIONS

JP Utility Model Publication No. 1-86327 (Jun. 7, 1989).

*Primary Examiner* — Vinh Nguyen
(74) *Attorney, Agent, or Firm* — Van Pelt, Yi & James LLP

(57) ABSTRACT

A capacitive coupling based sensor is disclosed. In some embodiments, a sensor comprises a transmitter and a receiver that are configured to be capacitively coupled when a coupling condition is satisfied as well as a circuit configured to determine whether a received signal that is received by the receiver matches a transmitted signal that is transmitted by the transmitter.

20 Claims, 7 Drawing Sheets

(56) References Cited

U.S. PATENT DOCUMENTS

| | | |
|---|---|---|
| 7,154,288 B2 * | 12/2006 | Kakizawa et al. .......... 324/750.3 |
| 7,428,142 B1 | 9/2008 | Ligtenberg et al. |
| 7,957,762 B2 * | 6/2011 | Herz et al. ................. 455/550.1 |
| 8,077,032 B1 | 12/2011 | Vier et al. |
| 8,395,370 B2 * | 3/2013 | Froniewski et al. ....... 324/76.11 |
| 2003/0064761 A1 | 4/2003 | Nevermann |
| 2003/0085679 A1 * | 5/2003 | Bledin et al. .................. 318/264 |
| 2006/0022682 A1 | 2/2006 | Nakamura et al. |
| 2008/0181353 A1 | 7/2008 | Ogata et al. |
| 2009/0058429 A1 * | 3/2009 | Harris et al. .................. 324/686 |
| 2009/0086879 A1 | 4/2009 | Ogata et al. |
| 2009/0160461 A1 * | 6/2009 | Zangl et al. .................. 324/684 |
| 2010/0207911 A1 | 8/2010 | Newton |
| 2010/0292945 A1 * | 11/2010 | Reynolds et al. ............... 702/65 |
| 2011/0319015 A1 | 12/2011 | Canegallo et al. |

* cited by examiner

Tx —302

Rx —304

CAPACITIVE COUPLING BASED SENSOR

CROSS REFERENCE TO OTHER APPLICATIONS

This application is a continuation of U.S. patent application Ser. No. 13/072,578 entitled CAPACITIVE COUPLING BASED SENSOR filed Mar. 25, 2011, now U.S. Pat. No. 8,395,370, which is incorporated herein by reference for all purposes, which claims priority to U.S. Provisional Patent Application No. 61/317,599 entitled PROXIMITY SWITCH filed Mar. 25, 2010 which is incorporated herein by reference for all purposes; U.S. Provisional Patent Application No. 61/400,394 entitled CLOSE PROXIMITY SENSOR TECHNOLOGY filed Jul. 26, 2010 which is incorporated herein by reference for all purposes; and U.S. Provisional Patent Application No. 61/412,340 entitled CLOSE PROXIMITY SENSOR filed Nov. 10, 2010 which is incorporated herein by reference for all purposes.

BACKGROUND OF THE INVENTION

Position detection switches have many applications. For example, a laptop or notebook computer typically includes a lid switch that triggers a sleep state when the lid of the device, which typically comprises the display of the device, is closed. FIG. 1 illustrates an embodiment of the general clamshell mechanical configuration of a notebook computer. As depicted, notebook computer 100 comprises a display plane 102 and a keyboard/control electronics plane 104. Planes 102 and 104 are hinged, allowing display plane 102 to be closed down onto keyboard plane 104 when the notebook computer is not being used. An open or closed state of notebook computer 100 is typically indicated by the state of a switch associated with planes 102 and 104. The state of the switch changes based on the positions of planes 102 and 104 relative to one another.

Existing lid switches most commonly comprise Hall Effect switches. Hall Effect switches require a magnet to be placed on either plane 102 or plane 104 and a sensor to be placed on the opposing plane. The magnet comprises a three-dimensional volume and may comprise an undesirable form factor, especially if placed on plane 102 since it may affect the maximum achievable active area of the display. However, more difficult routing may result if the magnet is instead placed on plane 104 and the sensor is placed on plane 102 since in such cases the signal from the sensor on plane 102 needs to be routed through the clamshell hinge to electronics on plane 104. Furthermore, the magnet of a Hall Effect switch may produce an undesirable magnetic field. The magnetic field may detrimentally affect certain functions associated with notebook computer 100, such as those requiring a compass. Moreover, magnets are relatively expensive components and require special processing and handling during manufacturing. Other commonly employed switches include mechanical displacement switches and optical beam interruption switches. Such switches may present similar form factor, routing, and manufacturing issues as Hall Effect switches and may also be affected by foreign object contaminations.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Figure 1:
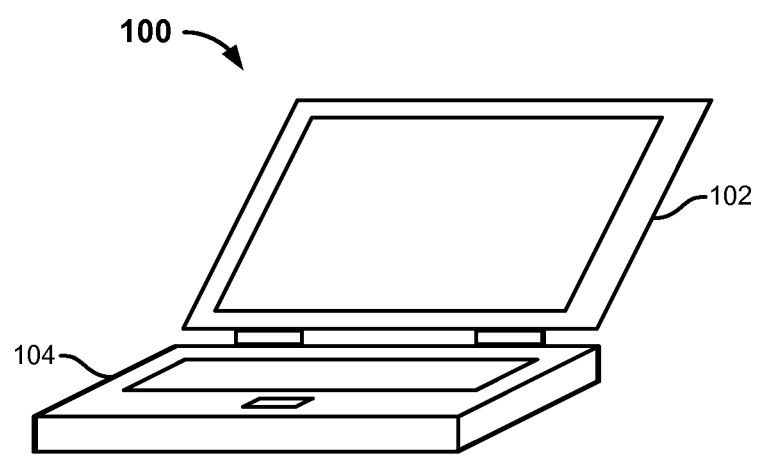
FIG. 1 illustrates an embodiment of the general clamshell mechanical configuration of a notebook computer.

Various configurations of an integrated circuit based sensor that employs capacitive coupling are disclosed. In some embodiments, such a sensor may be used as a switch. The disclosed techniques may be employed, for example, to differentiate between a plurality of states (e.g., true/false states, open/close states, on/off states, touch or close proximity states, etc.) and to generate an output signal based on the detected state that can be employed to facilitate an appropriate response. The disclosed sensor designs may be employed in a wide array of industrial applications. In some embodiments, the sensor may be employed as a position detection switch. Applications of such switches include, but are not limited to, lid switches of laptop computers such as notebook computer 100 of FIG. 1, mobile phones, PDAs, and other electronic devices; switches to detect printer latches and/or tray states; intrusion detection switches for systems such as for the hard drives of a data storage system; etc. In some embodiments, the sensor may be employed as a touch or proximity detection sensor. Applications of such sensors include, but are not limited to, touch sensors that replace mechanical buttons or switches; touch sensors for touch screens or track pads; close proximity or presence detection sensors, for example, that wake up systems such as tablet computers, mobile phones, PDAs, or other electronic devices from sleep states; etc. The capacitive coupling based sensor design described herein offers many advantages including low cost, low power consumption, and small form factor. Although some examples of sensor configurations and applications are provided herein, the disclosed techniques may be similarly employed with respect to any other appropriate configurations and applications.

Figure 2A:
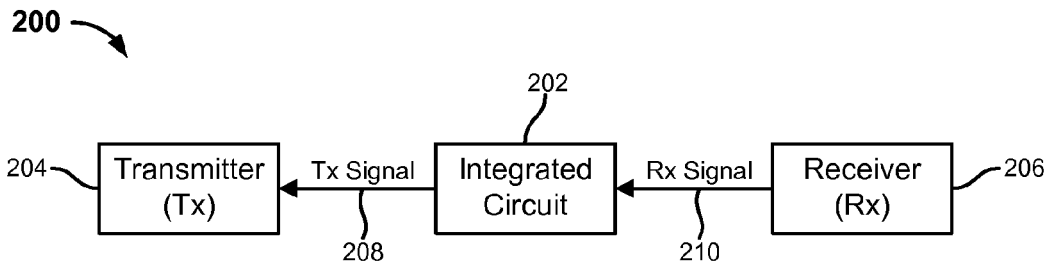
FIG. 2A illustrates a high-level block diagram of an embodiment of an integrated circuit based sensor that relies on capacitive coupling.

FIG. 2A illustrates a high-level block diagram of an embodiment of an integrated circuit based sensor that relies on capacitive coupling. As depicted, sensor 200 includes integrated circuit 202, transmitter 204, and receiver 206. Integrated circuit 202 generates a signal 208 that is transmitted by transmitter antenna 204. Furthermore, a signal 210 received by receiver antenna 206 is input into integrated circuit 202. Integrated circuit 202 compares transmitted signal 208 and received signal 210 to determine a state. For instance, integrated circuit 202 detects a first state if received signal 210 matches transmitted signal 208 and detects a second state if received signal 210 does not match transmitted signal 208. In such cases, for example, the first state would be detected by integrated circuit 202 if transmitter 204 and receiver 206 are sufficiently capacitively coupled such that the signal transmitted by transmitter 204 is received with adequate power or strength and/or within a threshold amount of error at receiver 206, and the second state would be detected by integrated circuit 202 if the signal transmitted by transmitter 204 is not received or is not received with adequate power or strength and/or within a threshold amount of error at receiver 206. Changes in coupling between transmitter 204 and receiver 206 are relied upon to differentiate between two or more states. Integrated circuit 202 actively scans received signal 210 for the transmitted pattern 208 and generates an output signal (not shown in FIG. 2A) based on the detected state. In some embodiments, the output signal comprises a binary true/false or 1/0 signal. The output signal may be employed by system management or other circuitry to facilitate an appropriate response or event. In various embodiments, the components of sensor 200 may be arranged in any appropriate mechanical configurations. In some embodiments, the components of sensor 200 are distributed across a plurality of planes that may be moved relative to one another in one or more directions, and such relative motion results in changes in capacitive coupling between transmitter 204 and receiver 206. In other embodiments, the active components of sensor 200 (i.e., integrated circuit 202, transmitter 204, and receiver 206) may be situated on approximately the same plane, and a passive component (not shown in FIG. 2A) that moves relative to the active components changes the extent of capacitive coupling, if any, between transmitter 204 and receiver 206 based on its position. These and other embodiments are described in further detail below.

Figure 2B:
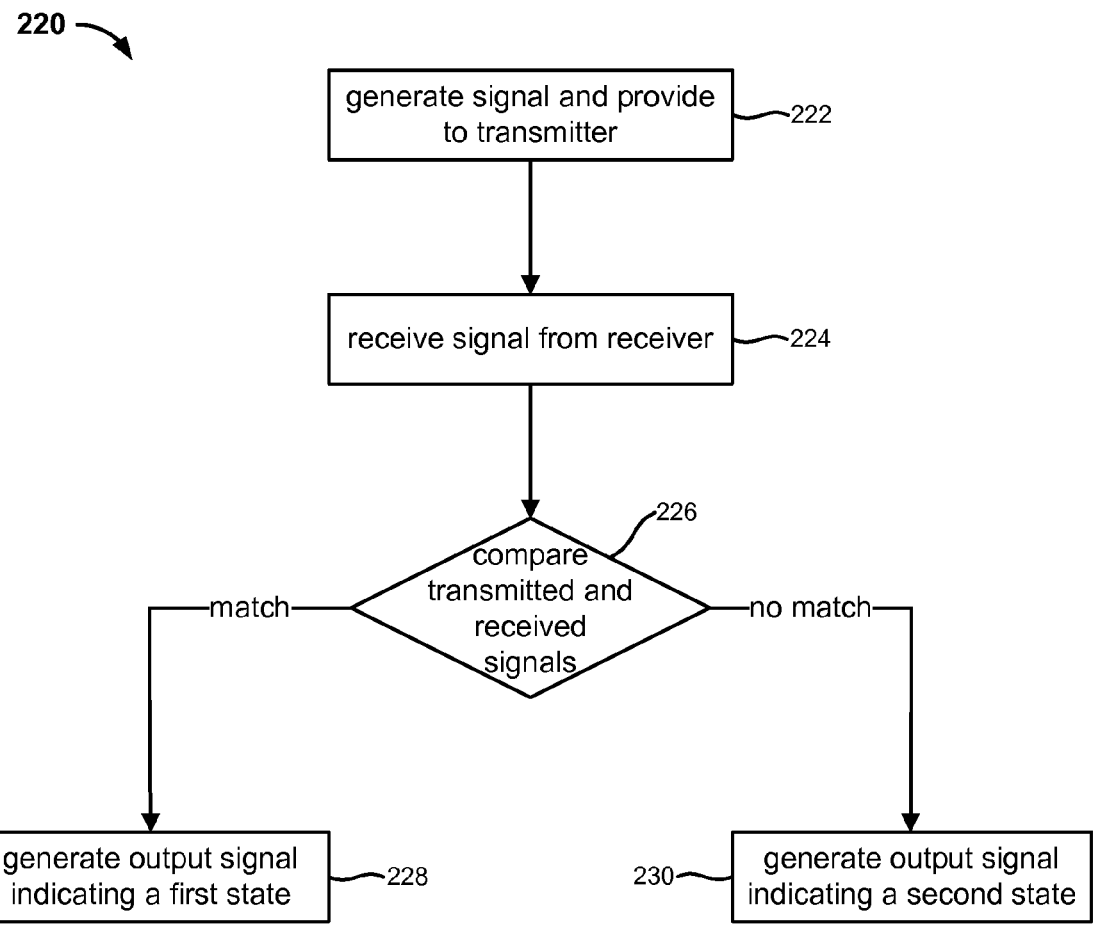
FIG. 2B illustrates an embodiment of a process for generating an output signal that indicates a state.

FIG. 2B illustrates an embodiment of a process for generating an output signal that indicates a state. In some embodiments, process 220 is employed by integrated circuit 202 of sensor 200 of FIG. 2A. Process 220 starts at 222 at which a signal is generated and provided to a transmitter. In some embodiments, the generated signal comprises a uniquely patterned signal. In some cases, the generated signal comprises a unique bit stream comprising either a fixed or configurable number of bits. For example, in one embodiment, the generated signal comprises a serial eight-bit stream. The pattern of the signal may be automatically selected or may be user configurable. In some embodiments, the signal comprises a low power and/or low frequency (e.g., 41 kHz) signal that does not substantially interfere with other applications such as Wi-Fi, Bluetooth, wireless radio, etc. At 224, a signal is received from a receiver. At 226, the transmitted and received signals are compared to determine whether the two signals match. Any appropriate matching algorithm as well as matching criteria and/or thresholds may be employed at 226 to determine whether the transmitted and received signals match or not. In some embodiments, 226 includes determining whether the power or strength (e.g., voltage) of the received signal satisfies a threshold. In some embodiments, determining whether the transmitted and received signals match at 226 comprises determining an error between the transmitted and received signals. In such cases, for example, a match condition may be satisfied if no or not more than a threshold amount of error between the transmitted and received signals is detected. In some embodiments, determining whether the transmitted and received signals match at 226 comprises determining whether the two signals match on average and/or consecutively for at least a prescribed number of samples. For example, in one embodiment, eight thousand samples of the transmitted pattern need to be consecutively or nearly consecutively (e.g., on average) detected in the received signal in order to satisfy a match condition. If it is determined at 226 that the transmitted and received signals match, an output signal indicating a first state of the sensor is generated at 228. If it is determined at 226 that the transmitted and received signals fail to match, an output signal indicating a second state of the sensor is generated at 230. The output signal generated at 228 and 230 may be employed, for example, to trigger an event or action for which the sensor is being used by an associated system.

Figures 3A, 3B:
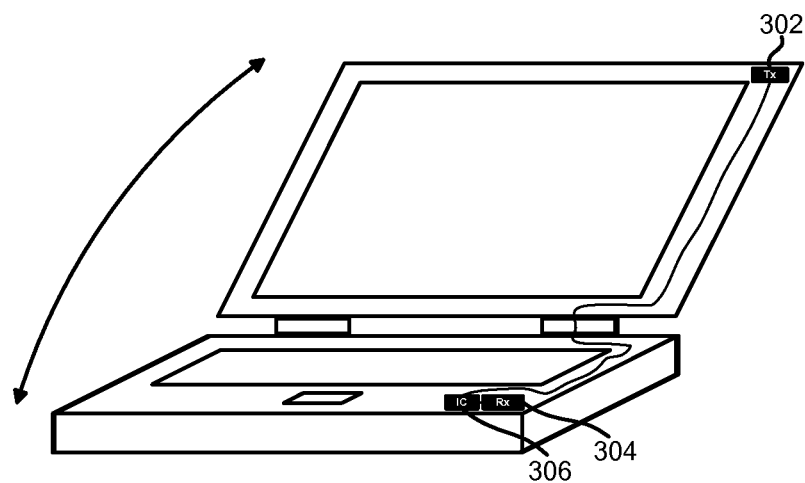
FIG. 3A illustrates an embodiment of the transmitter and receiver portions of a sensor configuration in which the two components are situated on different planes.
FIG. 3B illustrates an embodiment of an application of the sensor configuration of FIG. 3A.

FIG. 3A illustrates an embodiment of the transmitter and receiver portions of a sensor configuration in which the two components are situated on different planes. Although not depicted in FIG. 3A, the integrated circuit of the sensor is connected to both transmitter 302 and receiver 304 as depicted in FIG. 2A and may be situated on the same plane as either transmitter 302 or receiver 304 or on a different plane. In the given example, the coupling, if any, between transmitter 302 and receiver 304 changes in response to motion in one or more directions between the components. For example, in different embodiments, transmitter 302 and receiver 304 may be moved relative to one another in one or more of the x, y, and z directions. Based on the relative position of transmitter 302 and receiver 304 at any given time, receiver 304 either adequately picks up the signal transmitted by transmitter 302 via capacitive coupling or does not. A stronger signal is received by receiver 304 as the capacitance between transmitter 302 and receiver 304 increases, e.g., as the distance between transmitter 302 and receiver 304 decreases and/or as they become more aligned (e.g., their surface areas become more aligned). In some embodiments, transmitter 302 and receiver 304 have the same and/or similar shapes and/or geometries, e.g., to facilitate better capacitive coupling between the two components. As previously described, the associated integrated circuit compares the transmitted and received signals to generate an appropriate output signal.

FIG. 3B illustrates an embodiment of an application of the sensor configuration of FIG. 3A. As depicted, the sensor in FIG. 3B is employed as a lid switch of a notebook computer. In the given example, transmitter 302 is situated on the display plane and receiver 304 as well as associated integrated circuit 306 are situated on the keyboard plane of the notebook computer. Integrated circuit 306 is connected to both transmitter 302 and receiver 304, with the connection to transmitter 302 being routed through the keyboard plane, hinge, and display plane of the notebook computer. In this example, the extent of capacitive coupling, if any, between transmitter 302 and receiver 304 depends on the angle between the display plane and the keyboard plane of the notebook computer. A match state is detected by integrated circuit 306 when the notebook clamshell planes are closed or nearly closed such that the transmitter side of the capacitor plate and the receiver side of the capacitor plate are in close enough proximity for the circuit to be complete, i.e., for receiver 304 to adequately receive the transmitted signal. Conversely, an unmatch state is detected by integrated circuit 306 when the notebook clamshell planes are open since in such cases the capacitive coupling, if any, between transmitter 302 and receiver 304 is too weak to complete the circuit, i.e., for receiver 304 to adequately receive the transmitted signal. In this example, a match state may be employed by the notebook computer to enter a standby or sleep mode while an unmatch state may be employed by the notebook computer to wake up.

Figure 4A:
FIG. 4A illustrates an embodiment of a sensor configuration that employs a coupler.
Figure 4A:
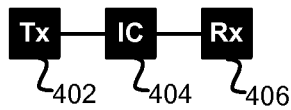

FIG. 4A illustrates an embodiment of a sensor configuration that employs a passive coupler. In this example, the active components of the sensor (transmitter 402, integrated circuit 404, and receiver 406) are situated on the same plane and thus are stationary relative to one another. However, in this embodiment, the sensor includes a passive component—coupler 408. In some embodiments, coupler 408 comprises a conductive material such as a metal strip or plate. No physical connection or contact exists between active components 402-406 and coupler 408, and coupler 408 is situated in a different plane than active components 402-406. Movement between the coupler and active components planes changes a coupling condition between transmitter 402 and receiver 406. In various embodiments, the planes may be moved relative to one another in one or more of the x, y, and z directions. In some embodiments, the shape and/or geometry of coupler 408 is selected (e.g., to match transmitter 402 and receiver 406) to facilitate coupling between transmitter 402 and receiver 406. Coupler 408 facilitates capacitive coupling between transmitter 402 and receiver 406, for example, when in close proximity to and/or properly aligned with transmitter 402 and receiver 406. Depending upon whether coupler 408 effectively bridges transmitter 402 and receiver 406 and closes the circuit between the two via capacitive coupling, receiver 406 either adequately picks up the signal transmitted by transmitter 402 or does not. A stronger signal is received by receiver 406 as the capacitances between coupler 408 and transmitter 402 and receiver 406 increase, e.g., as the distance between coupler 408 and the active components plane decreases and/or as coupler 408 becomes more aligned with transmitter 402 and receiver 406. As previously described, integrated circuit 404 compares the transmitted and received signals to generate an appropriate output signal.

Figure 4B:
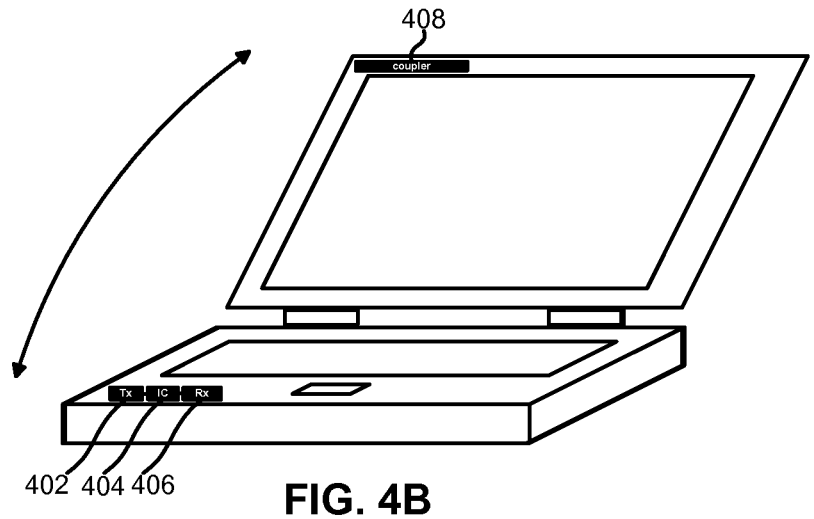
FIG. 4B illustrates an embodiment of an application of the sensor configuration of FIG. 4A.
Figure 4C:
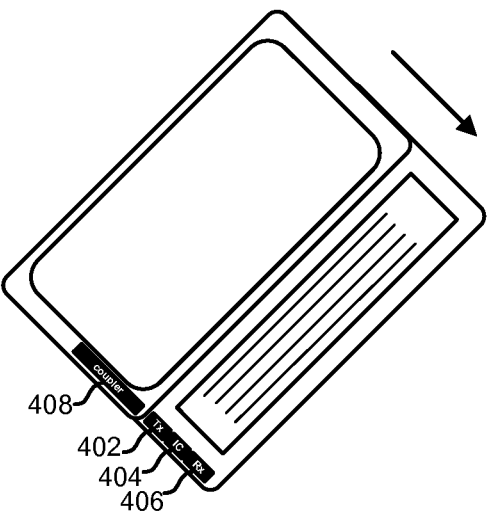
FIG. 4C illustrates an embodiment of an application of the sensor configuration of FIG. 4A.

FIG. 4B illustrates an embodiment of an application of the sensor configuration of FIG. 4A. As depicted, the sensor in FIG. 4B is employed as a lid switch of a notebook computer. In the given example, active components 402-406 are situated on the keyboard plane and coupler 408 is situated on the display plane of the notebook computer. Integrated circuit 404 is connected to both transmitter 402 and receiver 406. However, coupler 408 comprises a floating component of the sensor since it is not physically connected and/or in physical contact with any of active components 402-406. In this example, the extent of capacitive coupling, if any, between transmitter 402 and receiver 406 depends on the angle between the display plane and the keyboard plane of the notebook computer, i.e., the proximity and/or alignment of coupler 408 with respect to transmitter 402 and receiver 406. A match state is detected by integrated circuit 404 when the notebook clamshell planes are closed or nearly closed such that coupler 408 is in close enough proximity and alignment for the circuit to be complete, i.e., for receiver 406 to adequately receive the transmitted signal. Conversely, an unmatch state is detected by integrated circuit 404 when the notebook clamshell planes are open since in such cases coupler 408 is too far away to capacitively couple transmitter 402 and receiver 406 and complete the circuit, i.e., for receiver 406 to adequately receive the transmitted signal. In this example, a match state may be employed by the notebook computer to enter a standby or sleep mode while an unmatch state may be employed by the notebook computer to wake up. FIG. 4C illustrates an embodiment of another application of the sensor configuration of FIG. 4A that is employed to detect open and close states of the slide-out keyboard of a smart phone.

Figure 5A:
FIG. 5A illustrates an embodiment of a differential configuration in which the transmitters and receivers are situated on separate planes.
Figure 5B:
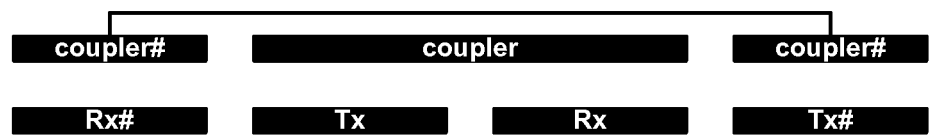
FIGS. 5B-5C illustrate embodiments of differential configurations in which the transmitters and receivers are situated on the same plane and are coupled via passive couplers.
Figure 5C:

The sensor embodiments of FIGS. 3A and 4A comprise single-ended configurations. In some embodiments, a differential configuration may be desirable. A differential configuration may provide, for example, improved range and/or security. For instance, a differential configuration may decrease sensor sensitivity to noise and/or interferences in the external environment which may otherwise be conducive to false outcomes. FIG. 5A illustrates an embodiment of a differential configuration in which the transmitters and receivers are situated on separate planes. The differential configuration of FIG. 5A is analogous to the single-ended configuration of FIG. 3A. FIGS. 5B-5C illustrate embodiments of differential configurations in which the transmitters and receivers are situated on the same plane and are coupled via passive couplers. The differential configurations of FIGS. 5B-5C are analogous to the single-ended configuration of FIG. 4A. One or both of the couplers in the crossed or keyed embodiments of FIGS. 5B-5C comprise multiple portions that are electrically connected together by a wire. In some embodiments, the Tx# and Rx# signals in FIGS. 5A-5C are inverted versions of the Tx and Rx signals, respectively. In the differential configurations of FIGS. 5A-5C, the corresponding pairs of transmitters and receivers (i.e., Tx and Rx; Tx# and Rx#) would not be properly coupled unless the correct configuration is employed, resulting in designs that are more immune to the influence of noise and other external factors. Although single-ended and differential configurations have been described, in other embodiments, a sensor may comprise any number of transmitters, receivers, and/or couplers, which may comprise any number of connected coupler portions.

Figure 6A:
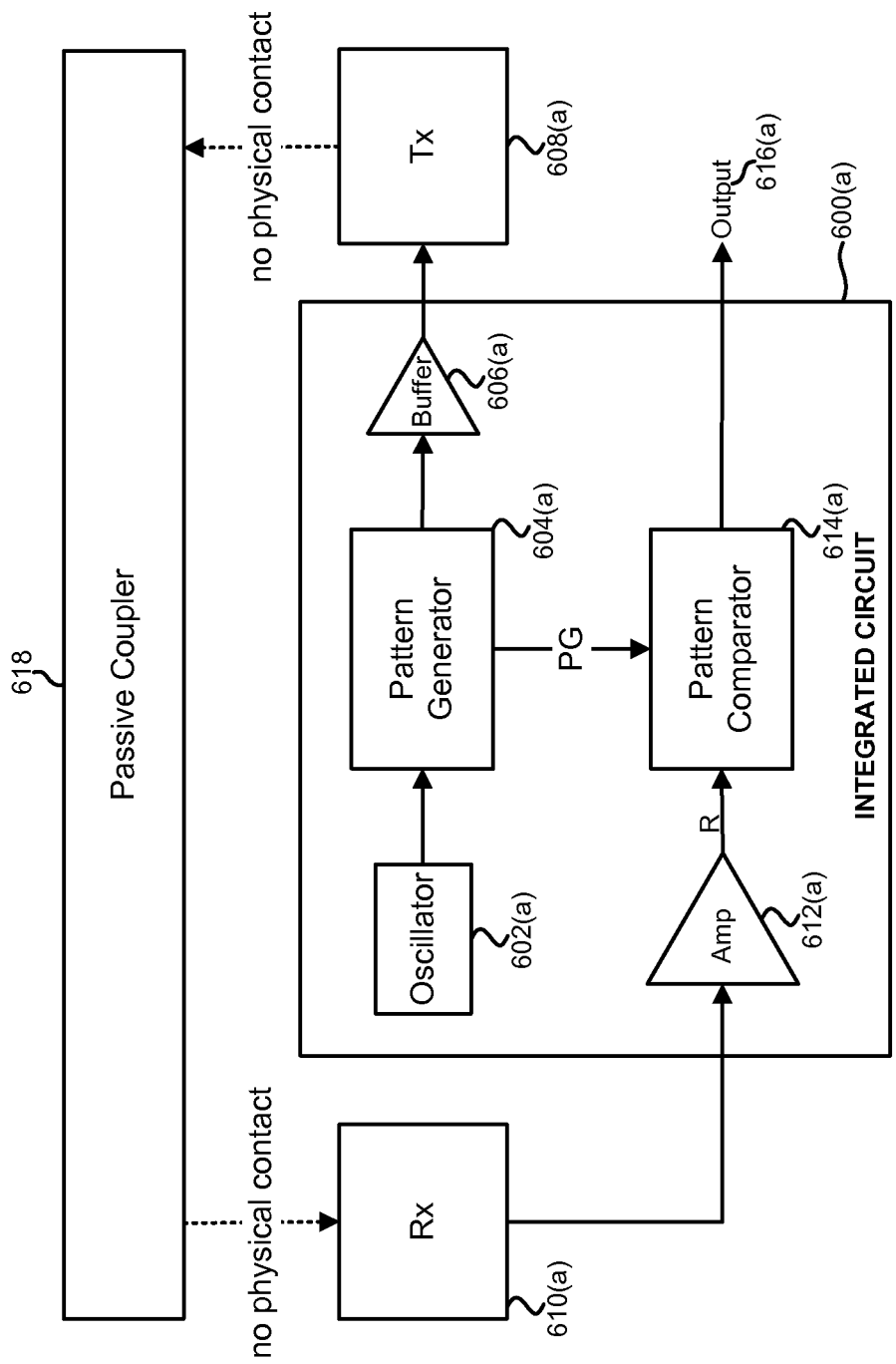
FIGS. 6A-6B illustrate circuit diagrams of two different sensor embodiments that show the major components of the integrated circuit of the disclosed sensor design.
Figure 6B:
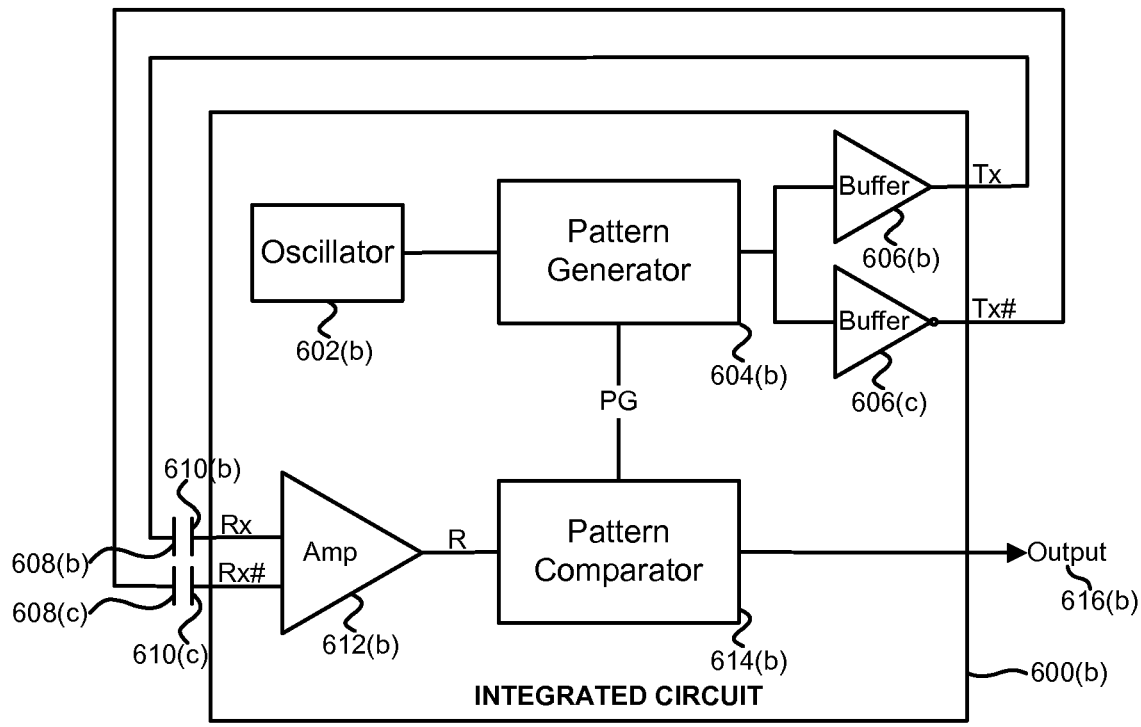
Figure 6C:
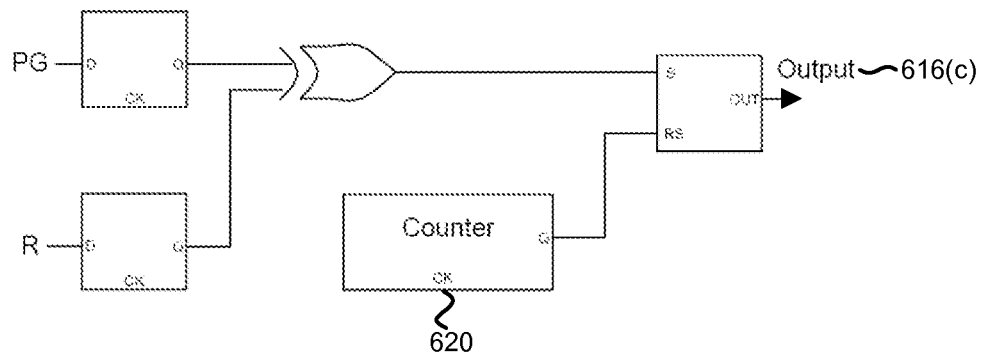
FIG. 6C illustrates a circuit diagram of the major components comprising an embodiment of a pattern comparator.

FIGS. 6A-6B illustrate circuit diagrams of two different sensor embodiments that show the major components of the integrated circuit of the disclosed sensor design. The embodiment of FIG. 6A corresponds to a single-ended, single-plane/passive coupler configuration such as that of FIG. 4A while the embodiment of FIG. 6B corresponds to a differential-mode, separate plane configuration such as that of FIG. 5A. Integrated circuit 600 includes oscillator 602, which provides a clock or reference frequency. Pattern generator 604 of integrated circuit 600 generates a patterned signal that has a low likelihood of being replicated by random noise. For example, pattern generator 604 may generate a noise rejecting code word of n-bit length, wherein n is a fixed or configurable value. The signal output by pattern generator 604 is amplified by buffer 606. The amplified signal output by buffer 606 is output from integrated circuit 600 and drives transmitter 608, which transmits the signal. A signal received by receiver 610 is input into integrated circuit 600 and amplified by amplifier 612. The amplified received signal is compared to the transmitted signal by pattern comparator 614. Output 616 of integrated circuit 600 indicates whether or not the received signal matches the transmitted signal based on the determination made by comparator 614. In the embodiment of FIG. 6A, the position of floating coupler 618 determines the extent of capacitive coupling, if any, between transmitter 608 and receiver 610. In the embodiment of FIG. 6B, the relative positions of corresponding transmitters 608 and receivers 610 determine the extent of capacitive coupling, if any, between transmitter 608 and receiver 610 pairs, which are modeled in FIG. 6B by the depicted capacitor plates. FIG. 6C illustrates a circuit diagram of the major components comprising an embodiment of pattern comparator 614. As depicted, each bit of the received and transmitted signals is compared as counter 620 counts to n (for an n-bit pattern), sends a reset pulse, and repeats. Although some of the major components of the integrated circuit of the disclosed sensor design have been described with respect to FIGS. 6A-6C, the integrated circuit may be configured in any appropriate manner and may comprise any one or more other appropriate components or circuitry, such as a digital-to-analog converter, an analog-to-digital converter, etc.

In various embodiments, the sensor design may include any one or more appropriate optional components. For example, in some embodiments, a tuning capacitor (e.g., having a value between 1-10 pF) may be connected between the receiver output and ground to adjust sensitivity. A shunting capacitor effectively trims down the sensing range. In some cases, the capacitor is external to the integrated circuit of the sensor. In some embodiments, the sensitivity can be adjusted by adding a boost circuit and/or a charge pump to the integrated circuit that increases the strength of the transmitted signal. Increasing the transmitted signal voltage in some cases increases the sensitivity range of the sensor. In some embodiments, active power consumption of the sensor may be reduced by adding circuitry to the integrated circuit that facilitates a sleep/wake duty cycle for the integrated circuit so that it is not constantly operating. For example, the integrated circuit may be configured to be operational only 10 ms out of every 1 s. In such cases, the sleep/wake duty cycle may be user configurable. In some embodiments, an analog filter may be employed between the receiver and amplifier for the received signal that has a passband centered around the transmitted signal frequency. Such a filter facilitates preventing noise picked up by the receiver from being processed by the integrated circuit, resulting in reduced active power consumption by the integrated circuit in many cases.

The sensor may optionally include auto-calibration circuitry. In some embodiments, such circuitry may be employed to automatically and dynamically compensate for any inherent self-coupling between the transmitter and receiver. For example, in the embodiments in which the transmitter and receiver are in the same plane (e.g., in the configurations of FIGS. 4A, 5B, and 5C), the proximity between the transmitter and receiver may induce a degree of self-coupling even when in a state when they should not be coupled. The extent of self-coupling may vary in each sensor based on non-ideal manufacturing tolerances (e.g., antenna pad geometry, material type, etc.) as well as the environment in which the sensor is deployed (e.g., nearby conductive objects may increase self-coupling). Auto-calibration may be performed during an unmatch state of the sensor when the transmitter and receiver should not be coupled. In some embodiments, the auto-calibration circuitry comprises a finite state machine that gradually steps up the reference voltage of the received signal amplifier until the self-coupling voltage is cancelled or nearly cancelled. In other embodiments, any other appropriate circuitry to correct for self-coupling may be employed. In some embodiments, an option to enable or disable the auto-calibration feature of the sensor is provided.

The disclosed sensor design may similarly be employed as a touch and/or presence detection sensor. In some embodiments, such a sensor comprises the configuration of FIG. 2A, and the transmitter and receiver are intentionally placed in close proximity to one another to trigger self-coupling. In such cases, a match state occurs when the self-coupling or electric field between the transmitter and receiver is not disturbed by an external object, and an unmatch state occurs when the self-coupling or electric field between the transmitter and receiver is disturbed by an external object. Any auto-calibration circuitry optionally employed with such a sensor would operate in a manner opposite to that described above, i.e., the associated finite state machine would gradually step down the reference voltage to compensate for any self-coupling that may exist in the unmatch state. An example application of such a sensor with respect to a cell phone includes de-activating the touch screen of a smart phone during active call time when human presence in close proximity to the touch screen is detected. Such a sensor may also be employed to detect human proximity to a system (e.g., a tablet computer or other electronic device) to wake up the system.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A sensor, comprising:
 a first transmitter and a first receiver configured to be capacitively coupled when a first passive coupler is in proximity to the first transmitter and the first receiver;
 a second transmitter and a second receiver configured to be capacitively coupled when a second passive coupler is in proximity to the second transmitter and the second receiver; and
 an integrated circuit coupled to the transmitters and the receivers configured to determine whether a signal transmitted by the first transmitter is received by the first receiver and an inverted version of the signal transmitted by the second transmitter is received by the second receiver;
 wherein at least one of the first passive coupler and the second passive coupler comprises a plurality of portions that are not adjacently situated.
2. The sensor of claim 1, wherein the integrated circuit is further configured to generate an output signal and wherein the output signal comprises a first state when both transmitter and receiver pairs are capacitively coupled and otherwise comprises a second state.

3. The sensor of claim 1, wherein the transmitters and the receivers are situated approximately in a single plane.

4. The sensor of claim 1, wherein each passive coupler comprises a conductive material.

5. The sensor of claim 1, wherein the integrated circuit is further configured to generate the signals transmitted by the transmitters.

6. The sensor of claim 1, wherein determining that a transmitted signal is received by a corresponding receiver comprises determining the strength of a received signal.

7. The sensor of claim 1, wherein determining that a transmitted signal is received by a corresponding receiver comprises determining an error, if any, between a received signal and the corresponding transmitted signal.

8. The sensor of claim 1, wherein determining that a transmitted signal is received by a corresponding receiver comprises determining that a received signal and the corresponding transmitted signal match for a prescribed number of samples.

9. The sensor of claim 1, wherein the signal comprises a patterned signal.

10. The sensor of claim 1, wherein the transmitters, the receivers, and the integrated circuit comprise one or more of a switch, a position detection sensor, a proximity detection sensor, a presence detection sensor, and a touch sensor.

11. The sensor of claim 1, wherein the integrated circuit comprises a plurality of components for providing a plurality of functionalities.

12. The sensor of claim 1, wherein each of the first passive coupler and the second passive coupler comprises a plurality of portions.

13. The sensor of claim 12, wherein portions comprising each passive coupler are alternatively situated such that portions comprising the same passive coupler are not adjacent.

14. The sensor of claim 1, wherein no physical connection exists between the passive couplers and the transmitters, the receivers, and the integrated circuit.

15. The sensor of claim 1, wherein the sensor comprises a differential configuration.

16. The sensor of claim 1, wherein the plurality of portions is electrically connected together by a wire.

17. A method for providing a sensor, comprising:
configuring a first transmitter and a first receiver to be capacitively coupled when a first passive coupler is in proximity to the first transmitter and the first receiver;
configuring a second transmitter and a second receiver to be capacitively coupled when a second passive coupler is in proximity to the second transmitter and the second receiver; and
configuring an integrated circuit coupled to the transmitters and the receivers to determine whether a signal transmitted by the first transmitter is received by the first receiver and an inverted version of the signal transmitted by the second transmitter is received by the second receiver;
wherein at least one of the first passive coupler and the second passive coupler comprises a plurality of portions that are not adjacently situated.

18. The method of claim 17, wherein each of the first passive coupler and the second passive coupler comprises a plurality of portions.

19. The method of claim 18, wherein portions comprising each passive coupler are alternatively situated such that portions comprising the same passive coupler are not adjacent.

20. A computer program product for providing a sensor, the computer program product being embodied in a non-transitory computer readable storage medium and comprising computer instructions for:
configuring a first transmitter and a first receiver to be capacitively coupled when a first passive coupler is in proximity to the first transmitter and the first receiver;
configuring a second transmitter and a second receiver to be capacitively coupled when a second passive coupler is in proximity to the second transmitter and the second receiver; and
configuring an integrated circuit coupled to the transmitters and the receivers to determine whether a signal transmitted by the first transmitter is received by the first receiver and an inverted version of the signal transmitted by the second transmitter is received by the second receiver;
wherein at least one of the first passive coupler and the second passive coupler comprises a plurality of portions that are not adjacently situated.

* * * * *